United States Patent
Ito et al.

(10) Patent No.: US 6,770,519 B2
(45) Date of Patent: Aug. 3, 2004

(54) SEMICONDUCTOR MANUFACTURING METHOD USING TWO-STAGE ANNEALING

(75) Inventors: Takayuki Ito, Kanagawa-ken (JP); Kyoichi Suguro, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/263,273

(22) Filed: Oct. 3, 2002

(65) Prior Publication Data

US 2004/0018702 A1 Jan. 29, 2004

(30) Foreign Application Priority Data

Jul. 25, 2002 (JP) .................................... P2002-216807

(51) Int. Cl.[7] .................. H01L 21/336; H01L 21/8234
(52) U.S. Cl. .................. 438/197; 438/167; 438/530; 438/542; 438/543
(58) Field of Search ........................... 438/197, 149, 438/302, 455

(56) References Cited

U.S. PATENT DOCUMENTS

| | | | | |
|---|---|---|---|---|
| 5,773,337 A | * | 6/1998 | Lee | 438/199 |
| 5,817,536 A | * | 10/1998 | Nayak et al. | 438/17 |
| 6,218,250 B1 | * | 4/2001 | Hause et al. | 438/302 |
| 6,271,101 B1 | * | 8/2001 | Fukunaga | 438/455 |
| 6,569,716 B1 | * | 5/2003 | Suzuki | 438/149 |
| 6,642,122 B1 | * | 11/2003 | Yu | 438/372 |

FOREIGN PATENT DOCUMENTS

JP          9-190983          7/1997

* cited by examiner

*Primary Examiner*—Caridad Everhart
*Assistant Examiner*—Chuong A Luu
(74) *Attorney, Agent, or Firm*—Finnegan, Henderson, Farabow, Garrett & Dunner, L.L.P.

(57) ABSTRACT

A method of semiconductor device manufacture provided includes forming a gate insulating layer upon a single crystal semiconductor substrate, forming a gate electrode made from a polycrystal conductive film upon the gate insulating layer, implanting impurity in the gate electrode and in the surface layer of the semiconductor substrate adjacent to or separate from the gate electrode, performing a first heat treatment, and performing a second heat treatment. The first heat treatment performs heat treatment at a temperature that diffuses the impurity implanted mainly in the gate electrode and controls the diffusion of the impurity implanted in the surface layer of the semiconductor substrate. The second heat treatment performs heat treatment at a higher temperature and for a shorter time than the first heat treatment, and at a temperature that activates the impurity implanted in the semiconductor substrate.

16 Claims, 6 Drawing Sheets

SEMICONDUCTOR MANUFACTURING METHOD USING TWO-STAGE ANNEALING

CROSS REFERENCE TO RELATED APPLICATION

This application is based upon and claims the benefit of priority from the prior Japanese Patent Application No. 2002-216807 filed on Jul. 25, 2002, the entire contents of which are incorporated herein by reference.

BACKGROUND OF THE INVENTION

1. Field of the Invention

The present invention relates to a semiconductor apparatus manufacturing method. In particular, it relates to annealing required for impurity diffusion and activation processes.

2. Description of the Related Art

In recent years, the improvement of Large Scale Integrated Circuit (LSI) performance has been achieved by enhancing the integrated density, that is, by miniaturizing the elements used to configure an LSI. However, accompanying the miniaturization of elements, since parasitic resistance or a short channel effect may occur more easily, it has become important to form shallow p-n junctions with low resistance in order to prevent such occurrence.

As a method of forming the shallow p-n junction, that is, a shallow impurity diffusion layer, which is a source/drain region, in a well, performing ion implantation at low acceleration energy and shortening the subsequent annealing processing (heat treatment) is typically utilized for adjusting the diffusion depth to be shallow. For example a Rapid Thermal Anneal (RTA), which is performed in a matter of seconds using a halogen lamp is utilized as a short-time annealing method.

Nevertheless, calls are being made for even shallower p-n junction depths in addition to demands for miniaturization, and it appears as if it is necessary to form extremely shallow junctions of less than 20 nm. At present, although boron (B) is mainly used as the p-type impurity, and phosphorus (P) or arsenic (As) as the n-type impurity, it is difficult to form extremely shallow p-n junction depths under 20 nm even by adopting RTA since the diffusion factor of the impurity such as boron, phosphorus, or arsenic is relatively high in a silicon (Si) substrate.

In addition, in the case of using a halogen lamp, it is difficult to adjust the illuminating time to be several hundred ms or shorter, and there is a limit to how much the annealing time can be reduced. Meanwhile, when the annealing temperature, that is, the luminous energy intensity is lowered in order to control impurity diffusion, the activation rate of the impurity declines drastically, and resistance in the impurity diffusion layer rises. Accordingly, it is difficult to form a shallow impurity diffusion layer with a depth of less than 20 nm with low resistance through RTA processing using a halogen lamp.

Recently, a flash-lamp annealing method using a xenon (Xe) flash lamp has been considered by the inventers of the present invention in place of the conventional RTA processing method using a halogen lamp. The xenon flash lamp is a white light having a wide range light-emitting wavelength, from the visible region to near-infrared region, and is a light source capable of illuminating for extremely short time periods of several 100 $\mu$m to 10 ms. It becomes possible to perform instantaneous annealing at high temperatures by adopting this flash-lamp annealing method using the xenon flash lamp. As a result, it is possible to activate the impurity and form a shallow p-n junction with low resistance without causing diffusion of the ion-implanted impurity.

Typically, in the manufacturing process of a MOS transistor using a polycrystal silicon gate electrode, which is called a poly-Si gate, when an impurity is ion-implanted into a semiconductor substrate, the impurity is also ion-implanted into the gate electrode in order to lower the resistance of the gate electrode. Resistance is then lowered by activating the impurity implanted in the semiconductor substrate, in addition to diffusing the impurity in the gate electrode layer throughout the gate electrode and causing activation through the annealing process.

Since the emission time of the lamp is extremely short in the annealing method that uses a xenon flash lamp, extremely short time annealing treatment is possible, and since the impurity in the semiconductor substrate is activated without causing diffusion, it is possible to form a shallow source/drain region. However, since annealing time is extremely short, the implanted impurity may not be diffused throughout the gate electrode, and a region where impurity diffusion is unsatisfactory may remain in the gate electrode. This unsatisfactory impurity region becomes depleted, causing a lowering of capacitance, which as a result invites a drop in the driving force of the transistor.

Accordingly, the annealing method using a xenon flash lamp may form an impurity diffusion layer, which is a source/drain region, with low resistance and a shallow junction, however, since a depletion layer remains in the gate electrode, even if a microscopic transistor is formed, high performance transistor characteristics with the miniaturized elements accompanying miniaturization may not be obtained.

SUMMARY OF THE INVENTION

According to embodiments of the present invention, a method of manufacturing a semiconductor device includes forming a gate insulating layer upon a single clystal semiconductor substrate, forming a gate electrode made from a polycrystal conductive film upon the gate insulating layer, implanting an impurity in the gate electrode and in the surface layer of the semiconductor substrate adjacent to or separate from the gate electrode, performing a first heat treatment, and performing a second heat treatment. Here, the first heat treatment performs heat treatment at a temperature that diffuses the impurity implanted mainly in the gate electrode and controls the diffusion of the impurity implanted in the surface layer of the semiconductor substrate. The second heat treatment performs at a higher temperature and for a shorter time than the first heat treatment, and at a temperature that activates the impurity implanted in the semiconductor substrate.

DETAILED DESCRIPTION OF THE EMBODIMENTS

Figure 1A:
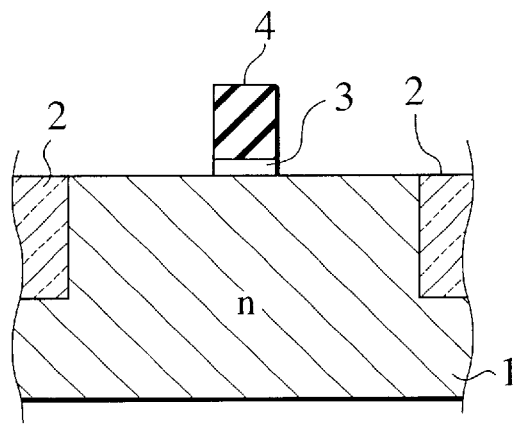
FIG. 1A through FIG. 1F are cross-sectional diagrams of a semiconductor apparatus at each step, which illustrate a semiconductor manufacturing method in accordance with an embodiment of the present invention.

An embodiment of the present invention is described forthwith while referencing the drawings.

FIG. 1A through FIG. 1F are process diagrams illustrating a semiconductor apparatus manufacturing method according to an embodiment of the present invention. In this case, a manufacturing process for a microscopic p-type MOS transistor formed in a logic circuit or memory region is taken as an example and described.

A principal feature of the manufacturing method of this embodiment is to perform the annealing following an ion-implantation process in two stages: a pre-annealing (first heat treatment) step and a flash-lamp annealing (second heat treatment) step, in order to form a source/drain region. This manufacturing method will be described specifically with referring to the drawings.

To begin with, as shown in FIG. 1A, isolation regions 2 are formed in a silicon (Si) substrate 1 having an n-type impurity doped in the n-type single crystal or p-type single crystalline surface region in order to define an activation region in accordance with a conventional p-type MOS transistor manufacturing method. Preferably, a Shallow Trench Isolation (STI) structure is adopted for these isolation regions 2, as shown in the figure. The STI structure is obtained by forming a trench in the silicon substrate 1, filling in this trench with an insulation film such as an $SiO_2$ film, and making the surface flat. Then, a thin insulation film, for example an $SiO_2$ film of no greater than approximately 3 nm is formed as a gate insulating layer 3, and a poly-Si film with a thickness of approximately 175 nm is further formed on the gate insulating layer 3, and a gate electrode 4 is formed from a poly-Si film through selective etching.

Figure 1B:
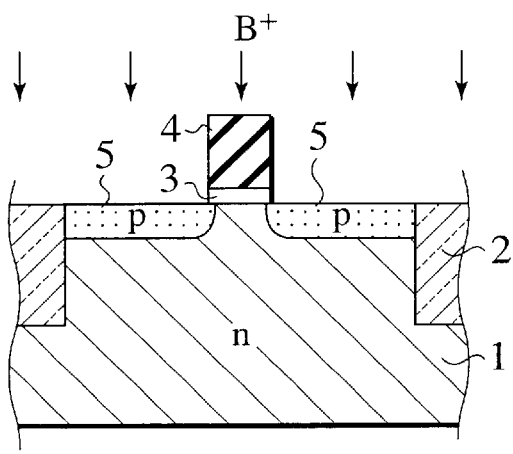

Next, as shown in FIG. 1B, in order to form a source/drain extension region, ion implantation of boron ($B^+$) is performed on the surface layer of the silicon substrate 1 using the gate electrode 4 as an ion implantation mask. The ion implantation conditions are, for example, acceleration energy of 0.2 keV and dose amount of $1 \times 10^{15}$ $cm^{-2}$. With this ion implantation, shallow impurity ion implantation regions 5 are formed on the surface layer of the silicon substrate 1 adjacent to the gate electrode 4.

Then, an annealing is performed to activate the impurity ions in the impurity ion implantation regions 5. This annealing may be RTA processing using a conventional halogen lamp, preferably flash-lamp annealing, which is short time/high temperature treatment, is performed using a xenon (Xe) flash lamp. It should be noted that this flash-lamp annealing is performed under conditions similar to the second heat treatment processing conditions for forming the source/drain region to be described later.

Figure 2:
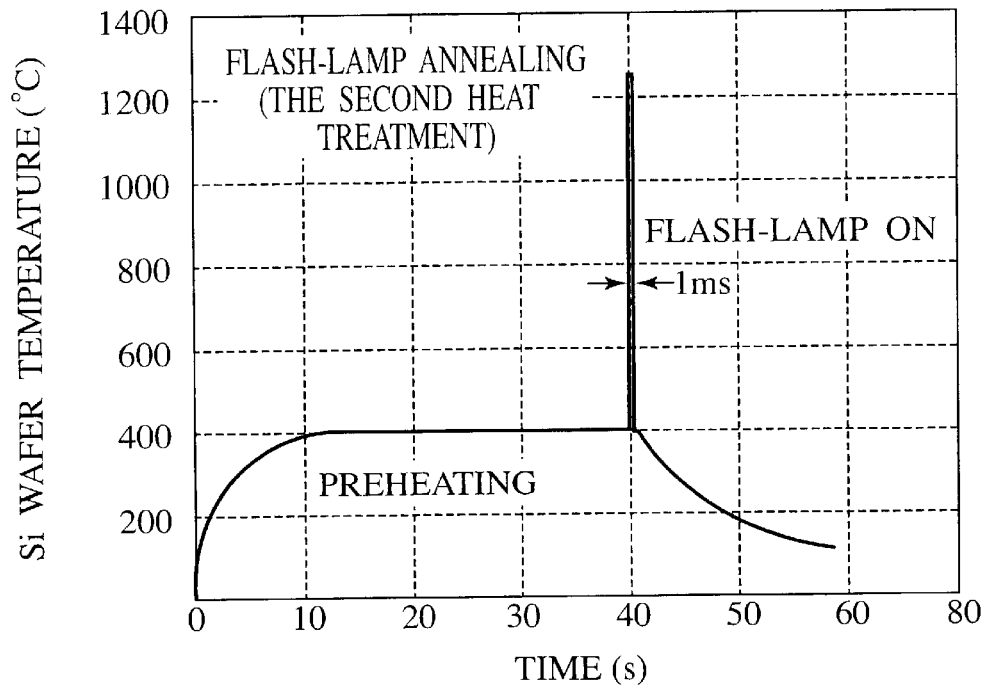
FIG. 2 is a diagram illustrating the temperature profile of a flash-lamp annealing process in accordance with an embodiment of the present invention.

FIG. 2 is a graph illustrating these flash-lamp annealing conditions. As shown in FIG. 2, with flash-lamp annealing, first the silicon substrate 1 is heated to a temperature of approximately 400° C. using a hot plate or other heater, then light of a xenon flash lamp is irradiated on the entire surface of the silicon substrate 1 for an extremely short time period, for example, approximately 1 ms. In this case, the irradiation energy density of the xenon flash lamp is, for example, approximately 35 $J/cm^2$. By such a short time irradiation of the xenon flash lamp, the surface of the silicon substrate 1 reaches, for example, a temperature of 1100° C. or higher, which sufficiently activates the ion implanted impurity elements.

Figure 1C:
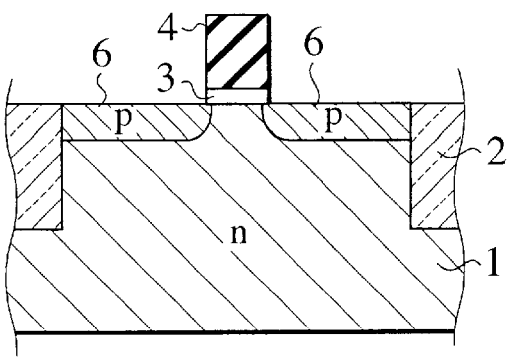

With the flash-lamp annealing using a xenon flash lamp, since an extremely short time annealing, which is even faster than conventional RTA using a halogen lamp, is performed, crystal defects in the impurity ion implantation regions can be recovered and activated with substantially no diffusion of implanted impurity ions in the depth direction. As a result, as shown in FIG. 1C, extremely shallow extension regions 6 of low resistance can be formed with a depth of approximately 10 nm.

It should be noted that in the case of performing RTA using a halogen lamp instead of the flash-lamp annealing treatment, a substrate temperature of 800° C. or lower with a heating time period of about 10 seconds is desired. It is also possible to activate the impurity elements, to recover the crystal defects in the impurity ion implantation regions 5, and to form the source/drain extension regions 6 without diffusing the impurity deeply in the substrate with this RTA.

Figure 1D:
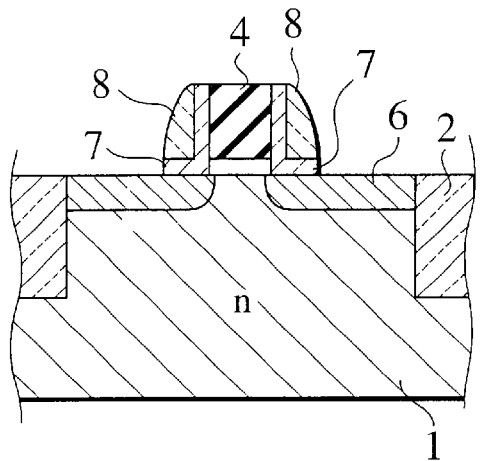

Next, as shown in FIG. 1D, sidewall spacers with a multi-layer structure are formed at the sidewalls of the gate electrode 4. A silicon nitride film (SiN film) 7 and silicon oxide film ($SiO_2$ film) 8 are deposited in order, using a by Chemical Vapor Deposition (CVD) method, and then these film are anisotropically etched using Reactive Ion Etching (RIE), thus the SiN film 7 and $SiO_2$ film only at the side walls of the gate electrode 4 are leaved and sidewall spacers having the multi-layer structure shown in FIG. 1D is obtained.

Figure 1E:
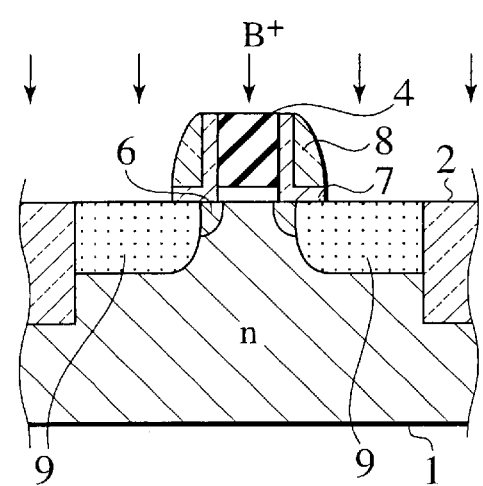

As shown in FIG. 1E, boron ($B^+$), which is a p-type impurity is ion implanted again using the sidewall spacers, which are made from the gate electrode 4, SiN film 7, and $SiO_2$ film 8, as the ion implantation mask. The ion implantation conditions are, for example, acceleration energy of 5 keV and a dose amount of $3 \times 10^{15}$ $cm^{-2}$. With this ion implantation, deep impurity ion implantation regions 9 are formed in the surface layer of the silicon substrate 1 separated from the end of the gate electrode 4. In this case, a large amount of impurity ions $B^+$ are also implanted in the gate electrode 4, which is made from polycrystal silicon.

Next, an annealing is performed in order to activate the impurity ion implantation regions 9 and diffuse the ions implanted in the gate electrode. With this embodiment, it is different from the conventional processing in that this annealing is performed in two stages: the first heat treatment; and the second heat treatment.

Figure 3:
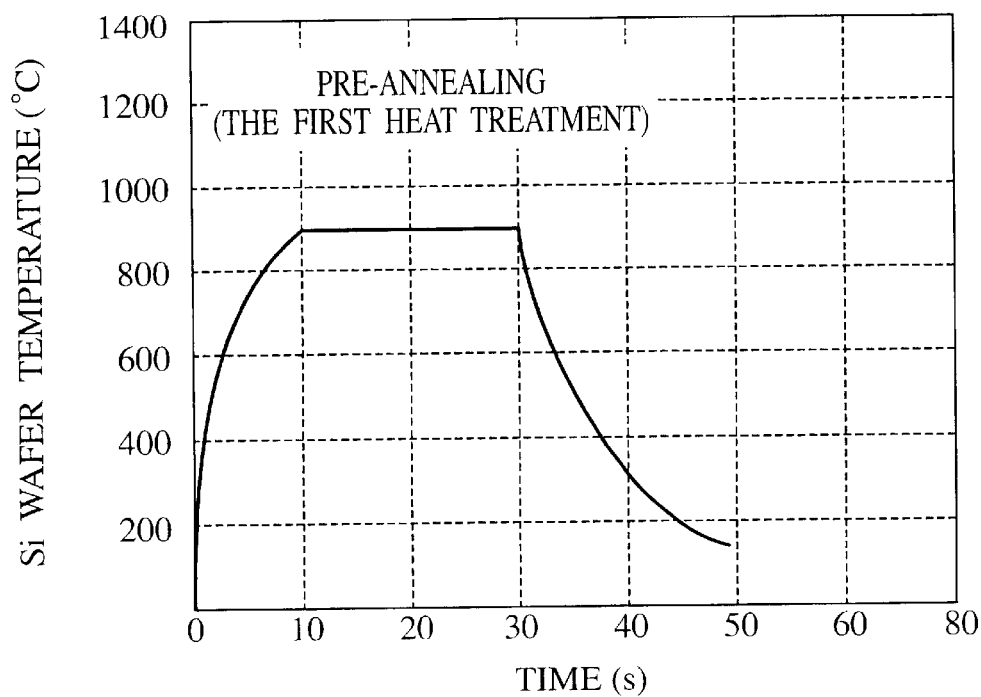
FIG. 3 is a diagram illustrating a temperature profile of a pre-anneal process according to an embodiment of the present invention.

To begin with, the first heat treatment, which is called pre-anneal, is performed through RTA using a halogen lamp. The pre-anneal conditions are shown in FIG. 3. As shown in FIG. 3, the pre-anneal conditions are set to, for example, substrate temperature of 900° C. and anneal time of 20 seconds.

Typically, comparing an impurity implanted in polycrystal materials with an impurity implanted in single crystal materials, an impurity implanted in the polycrystalline materials diffuses easier at lower temperatures. This is because crystal grain boundaries, where an impurity easily diffuses, exist in the polycrystalline materials. Based on this impurity diffusion characteristic, impurity in the polycrystal gate electrode may diffuse, but the diffusion of an impurity in the single crystal semiconductor substrate can be restricted, as in the above-mentioned pre-anneal temperature conditions. Boron implanted in the gate electrode 4, which is made from the polycrystal silicon, diffuses in the depth direction in accordance with the boron concentration gradient, and spreads around the entire layer of gate electrode 4 at a thickness of approximately 175 nm. On the other hand, boron implanted in the single crystal silicon substrate 1 has substantially no diffusion and stays in the ion implantation regions 9. In this way, it is possible to facilitate diffusion of only boron in the gate electrode 4 and keep a shallow junction depth without causing the diffusion of the boron impurity in the extension region 6 that has already been formed.

Next, a second heat treatment is performed using the xenon flash lamp. Substantially the same conditions as the conditions of the flash-lamp annealing performed to form the extension regions 6 may be used as the flash-lamp annealing conditions for this second heat treatment, or activation of the impurity diffusion region. As shown in FIG. 2, under conditions where the substrate is pre-heated, for example, to a temperature of 400° C., the xenon flash lamp light is irradiated onto the surface of the entire substrate. The irradiation time period and irradiation energy density are, for example, set to be approximately 1 ms and 35 J/cm$^2$, respectively, and the temperature of the substrate surface layer is set to instantaneously reach a temperature allowing recovery of crystal defects in the impurity ion implanted region and activation of the implanted ions. In this case, the substrate temperature reaches 1100° C. or higher.

Figure 1F:
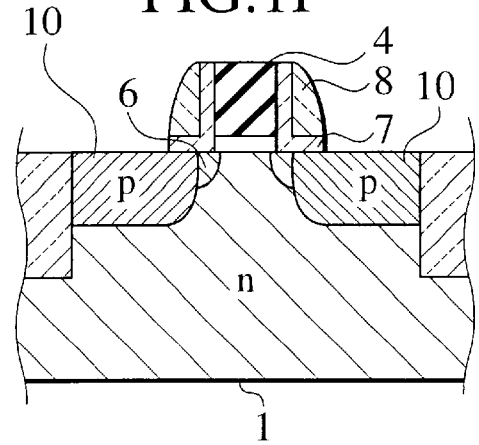

With this flash-lamp annealing, as shown in FIG. 1F, the ion implanted impurity is activated, the crystal defects in the impurity ion implantation region 9 are recovered, and deep source/drain regions 10 separated from the end of the gate electrode 4 is obtained. In addition, it is possible to control the impurity diffusion in the extension region 6 and keep a shallow junction depth because it is an extremely quick annealing treatment.

Although the subsequent processes are not shown in the figures, an SiO$_2$ film is formed as the inter-layer insulating layer upon the entire surface at a film deposition temperature of 400° C. with the normal pressure CVD method in accordance with a typical MOS transistor manufacturing method. Contact holes are then opened in the inter-layer insulating layer, wirings drawn from the source/drain regions 10 and the gate electrode 4, respectively, are formed.

In this way, with the semiconductor manufacturing method according to this embodiment, the annealing process used for forming the source/drain region controls the diffusion of the impurity implanted in the single crystal silicon substrate 1. Also it is possible to both improve the transistor characteristics and form an extremely shallow junction of less than 20 nm since the annealing includes a pre-anneal (first heat treatment) and a flash-lamp annealing (second heat treatment). The pre-anneal (first heat treatment) is preformed under temperature conditions capable of facilitating the diffusion of impurity implanted in the gate electrode 4 made from the polycrystal silicon, and the flash-lamp annealing which is an extremely short-time annealing is performed under conditions capable of activating the impurity implanted in the single crystal silicon substrate 1.

Study 1

Figure 4A:
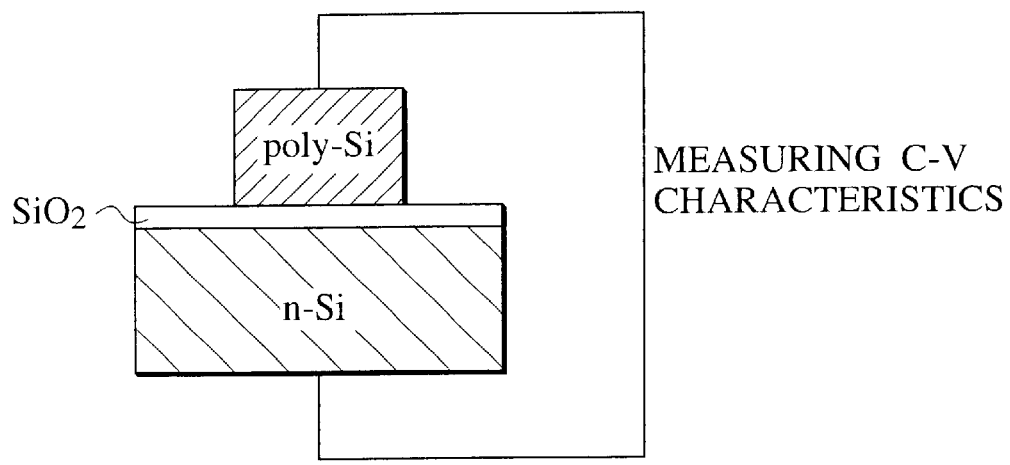
FIG. 4B is a diagram illustrating the relationship between the respective gate capacitance and gate voltage of a MOS gate of Example, which is formed using a two-stage annealing method according to an embodiment of the present invention, and of each respective MOS gate of Comparative example using only flash-lamp annealing instead of two-stage annealing and of a second comparative example using a conventional annealing method. It should be noted that FIG. 4A is a schematic diagram of a MOS gate sample used for measurement.
Figure 4B:
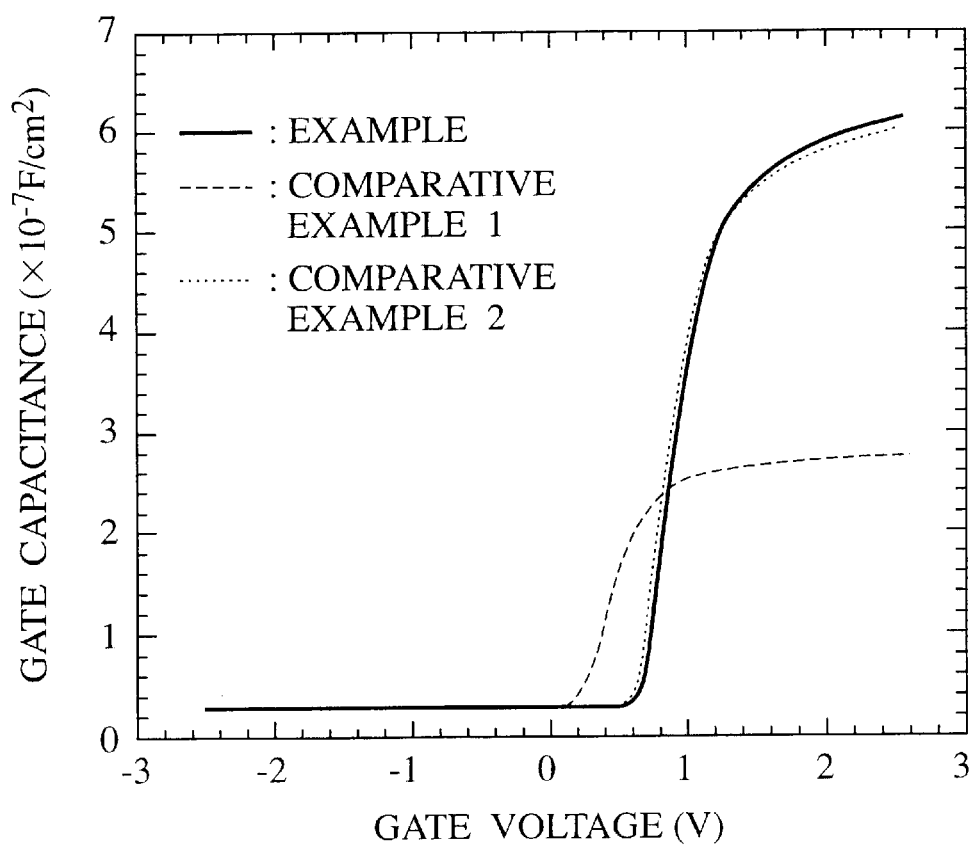

In order to examine the gate electrode characteristics obtained using the manufacturing method of this embodiment, a MOS capacitor (hereafter, referred to as the capacitor of Example) having the structure shown in FIG. 4A was formed, and the Capacitance/Voltage (C-V) characteristics measured under the same conditions as those of the manufacturing method shown in the above-mentioned embodiment. In addition, as Comparative example 1, a similar MOS capacitor (hereafter, referred to as the capacitor of Comparative example 1) was manufactured under the same conditions as those of the manufacturing method according to Example except that only flash-lamp annealing (second heat treatment) is performed without performing the pre-anneal (first heat treatment). Furthermore, as Comparative example 2, a MOS capacitor (hereafter, referred to as the capacitor of Comparative example 2) was formed under the same conditions as those of Example except that only RTA is performed under the conditions of the conventional method at 1015° C. and for 10 seconds. The C-V characteristics were measured for each MOS capacitor and the results are shown in FIG. 4B.

With the MOS capacitor of Example, a gate capacitance of approximately 6×10$^{-7}$ F/cm$^2$ was obtained with a gate voltage of 2.5 V and frequency of 100 kHz. This value is equal to the gate capacitance value of the MOS capacitor obtained by Comparative example 2 (a conventional example) where only RTA processing using a halogen lamp is performed. In addition, the C-V characteristics substantially match. In comparison, in the case of Comparative example 1 where only flash-lamp annealing is performed, the gate capacitance of the MOS capacitor was approximately 2.6×10$^{-7}$ F/cm$^2$ under the conditions of the same gate voltage and the same frequency.

With the MOS capacitor of Comparative example 1 where only flash-lamp annealing was performed, gate capacitance decreased and the results are similar to the case where the insulation film beneath the gate electrode is formed to be apparently thick. In other words, it may be thought that since the annealing treatment time for performing only xenon flash lamp annealing is extremely short, boron, the impurity in the gate electrode, does not diffuse deeply into the gate electrode, an insufficient impurity concentration region remains at the bottom of the gate electrode, and a depletion layer is formed. The thickness of this depletion layer calculated from the gate capacitance value reaches approximately 23 nm in the case where the entire gate electrode thickness is 175 nm.

From these results, it was confirmed that impurity diffusion in the gate electrode progresses and development of a depletion layer is prevented through a pre-anneal process (first heat treatment process), which is performed to form the source/drain region according to this embodiment.

When a depletion layer remains at the bottom of the gate electrode, not only is the transistor driving force reduced, but also a condition where the transistor may not fulfill its function also occurs. As a method for preventing gate electrode depletion, there is a method that increases acceleration energy in order to implant impurity ions more deeply in the ion implantation process prior to the annealing. In this case, it is highly possible to cause a short channel effect since diffusion of impurity implanted in the surface layer of the silicon substrate 1 proceeds in the depth direction and horizontal direction simultaneously. Also, the threshold voltage of the transistor varies depending on the penetration of the impurity into the gate insulating layer. If the two-stage annealing method, including the pre-anneal (first heat treatment) and xenon flash-lamp anneal (second heat treatment) illustrated in the above-mentioned embodiment is adopted, since mainly only impurity diffusion in the poly-crystal gate electrode is facilitated in the first heat treatment and each impurity is activated with substantially no effect on the depth of the source/drain region and extension region in the second heat treatment, the occurrence of the short channel effect is prevented.

Study 2

Next, in order to examine the relationship between the annealing conditions and boron impurity diffusion conditions in the gate electrode, concentration distribution in the depth direction of the impurity (boron) in the gate electrode was measured for each MOS transistor of Example formed under the manufacturing conditions of the above-mentioned embodiment and the MOS transistor of Comparative example formed under the same conditions except having only the annealing treatment conditions varied. The MOS transistor manufacturing method of Comparative example is performed under the same conditions as those of the MOS transistor of Example formed by the manufacturing method according to Example except that no pre-anneal (first heat treatment) is performed and only the flash-lamp anneal (second heat treatment) is performed.

Figure 5:
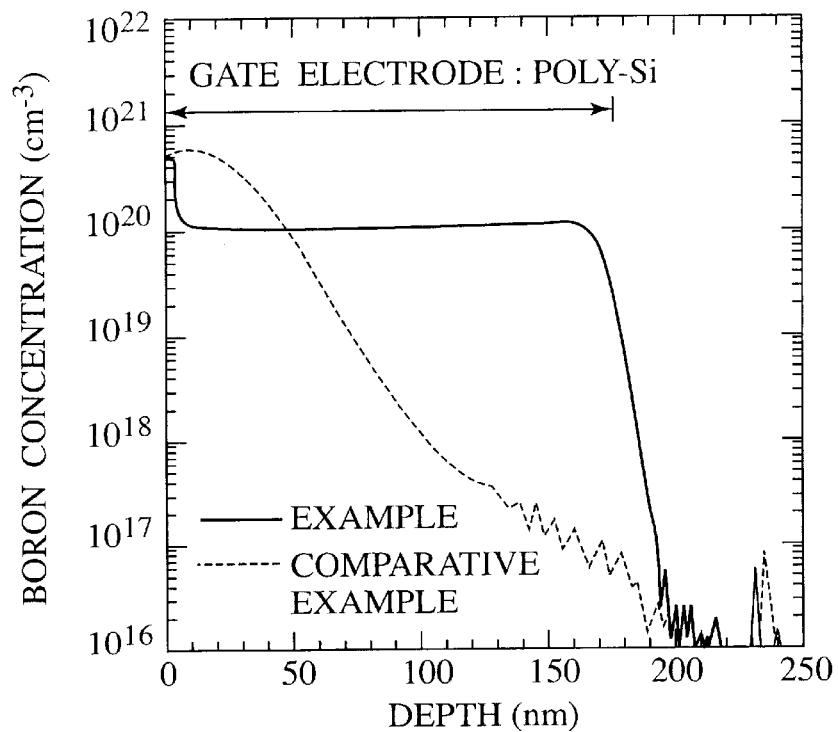
FIG. 5 is a diagram illustrating the concentration distributions of boron (B) in the gate electrode of Example formed using a two-stage annealing method according to an embodiment of the present invention and in the gate electrode of a comparative example formed using only the flash-lamp annealing method instead of two-stage annealing.

FIG. 5 is a graph illustrating the results of the concentration distribution of the impurity (boron) in the gate electrode measured in the depth direction for each transistor of Example and Comparative example. As shown in the graph, in the gate electrode of the transistor of Example, it is confirmed that boron is distributed substantially uniformly in the depth direction throughout the gate electrode and a high impurity concentration of approximately $10^{20}$ cm$^{-3}$ is obtained. Meanwhile, in the gate electrode of the transistor of Comparative example, high impurity concentration is shown in the shallow region, however, the deeper the depth becomes, the thinner the boron concentration becomes. Therefore, boron diffusion toward the deeper region becomes insufficient, and it is expected that depletion may occur in the region where the boron concentration is $10^{19}$ cm$^{-3}$ or less.

Study 3

Figure 6:
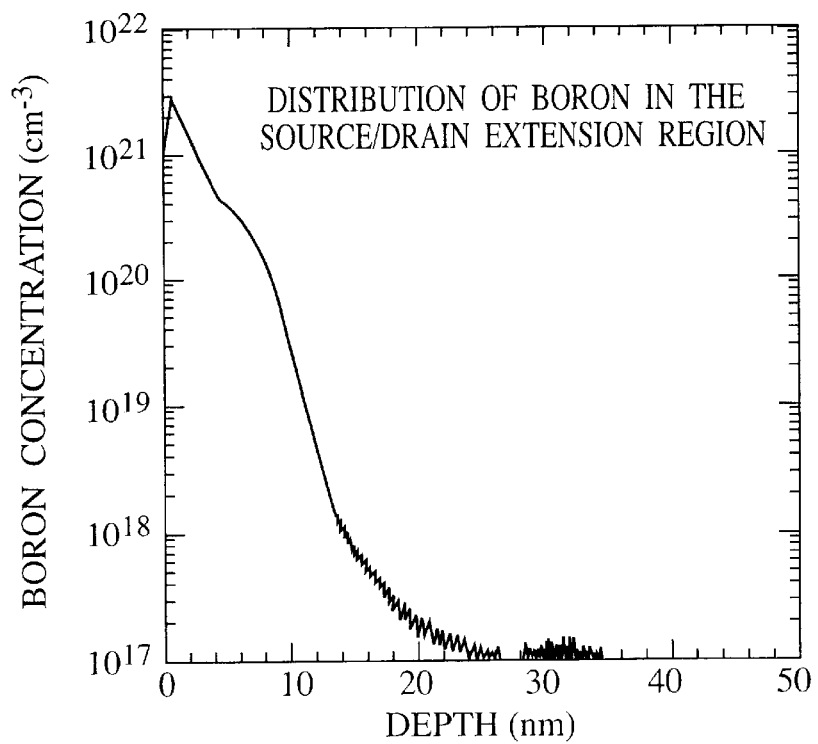
FIG. 6 is a diagram illustrating the concentration distribution of boron (B) within a source/drain extension region obtained through a manufacturing method according to an embodiment of the present invention.

FIG. 6 illustrates the concentration distribution of boron, the impurity in the source/drain extension region 6, obtained by the manufacturing method according to the embodiment. The depth where the concentration becomes $10^{18}$ cm$^{-3}$, that is, the substantial junction depth is approximately 14 nm, the diffusion layer resistance (sheet resistance) is 770 O/□, and it was confirmed that a shallow impurity diffusion layer with low resistance is formed. According to this result, it was confirmed that the junction depth of the extension region 6 may be kept at 20 nm or less by the two-stage annealing method according to this embodiment.

It should be noted that in order to suppress gate electrode depletion and give an impurity diffusion layer with a desired resistance value using only RTA with a halogen lamp and without performing a flash-lamp anneal, an annealing temperature of 1000° C. or higher and holding at that heated temperature for 10 seconds becomes necessary. With these annealing conditions, since the impurity in the extension region and source/drain region diffuse to the periphery and the shallow junction may not be maintained, the short channel effect may be occurred and transistor function may be lost.

Other Embodiments

In the above-mentioned embodiment, an example of using the poly-Si electrode as a gate electrode is described. However, the above-mentioned two-stage annealing method may also be utilized in order to form the source/drain region in the event of utilizing a structure where the surface layer portion of the gate electrode is made to be silicide in order to lower contact resistance between the gate electrode and interconnects.

Normally, in such a silicide layer formation, sputter deposition of cobalt (Co), titanium (Ti), nickel (Ni), or the like is performed upon the surface layer of the gate electrode and the surface layer portion of the source/drain region to form a self-aligned cobalt salicide, titanium salicide, or nickel salicide structure by siliciding the field insulation film. It should be noted that a thickness of approximately 30 nm is desired for the silicide layer. If the silicide layer becomes thicker, or the substantial thickness of the polycrystal silicon gate electrode becomes thinner, 3d-level transitional metal atoms, such as the above-mentioned cobalt, which may not completely form a silicide, diffuse from the gate electrode to the gate insulating layer since the diffusion coefficient in the silicon or $SiO_2$ is large, and the leak current from the gate electrode to the silicon substrate increases. If the thickness of the silicide layer is set to 30 nm or less in order to avoid the above-mentioned phenomena, contact resistance rises, and the transistor driving force decreases. Accordingly, a thickness of at least 100 nm or more is required for the gate electrode. Preferably, a thickness of 150 nm or more is desired.

In addition, in the above-mentioned embodiment, the case of forming a poly-Si gate electrode is described, but it is not limited to polycrystal silicon. The above-mentioned two-stage annealing method can be effectively applied in the case where the semiconductor substrate is made from a single crystal and the gate electrode is made from a polycrystal.

Figure 7:
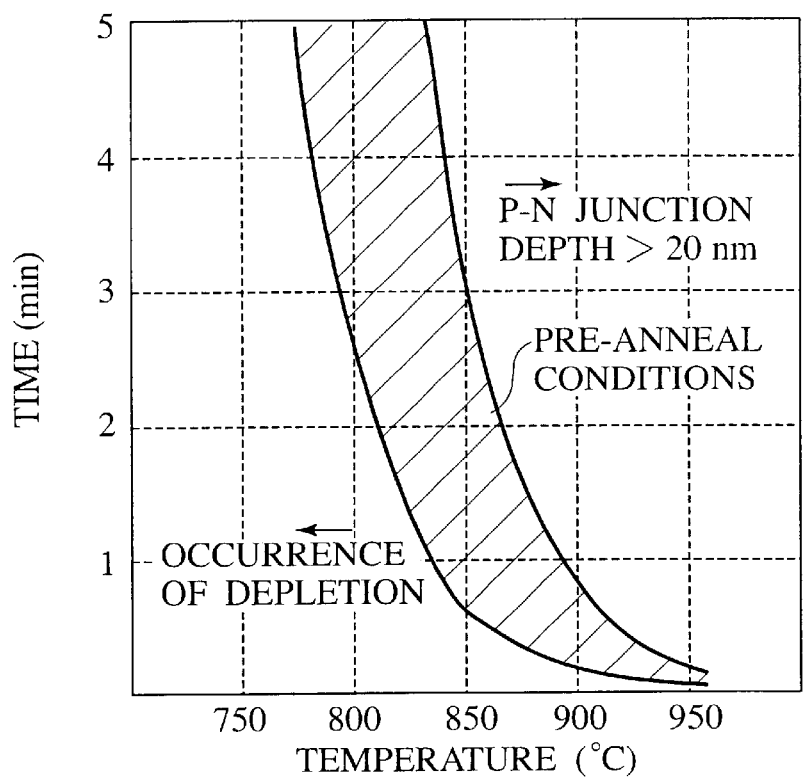
FIG. 7 is a diagram illustrating pre-anneal conditions according to an embodiment of the present invention.

In the above-mentioned embodiment, the pre-anneal (first heat treatment) conditions of the two-stage annealing treatment are set to 900° C., and 20 seconds, but the pre-anneal conditions are not limited to these settings. FIG. 7 illustrates examples of pre-anneal conditions. In the case where the poly-Si gate electrode thickness is approximately 175 nm, and the ion implantation process conditions, prior to the pre-annealing for boron impurity to be ion implanted, are acceleration energy of 0.2 keV and a dose amount of $1\times10^{15}$ cm$^{-2}$. The conditions illustrated in the shaded portion may control depletion in the polycrystal silicon gate electrode, and keep the junction depth to 20 nm or less in the formed source/drain extension region, as shown in the figure.

A temperature of 950° C. or lower is desired to control the junction depth of the impurity (boron) in the extension region of the silicon substrate to 20 nm or less. The pre-annealing time required depends on the annealing temperature conditions. For example, it is possible to control the junction depth of impurity (boron) in the extension region in the silicon substrate to 20 nm or less, diffuse the impurity implanted to the poly-Si gate electrode toward the bottom of the gate electrode, and avoid depletion if heating continues for 12 minutes at an annealing temperature of 800° C., 3 minutes at an annealing temperature is 850° C., or 40 seconds or shorter at an annealing temperature of 900° C.

It should be noted that the poly-Si gate electrode thickness is set at 175 nm, but between approximately 100 nm and 200 nm is also possible. The pre-anneal time may preferably vary in response to the film thickness, and it is desirable for the pre-annealing time to be shorter in the case where the gate electrode layer is thinner.

With this embodiment, for the flash-lamp annealing (second heat treatment), the irradiation energy density of the xenon flash lamp is set to be 35 J/cm$^2$ and irradiation time to 1 ms after the preheating of the substrate to 400° C., but it is not limited to these conditions. An irradiation time of 100 ms or shorter is practicable, however, in order to control impurity diffusion, it is desired to be as short as possible, preferably 10 ms or shorter. In the case where the irradiation time is 1 ms, it is possible to change the preheating temperature within the range of 200 to 550° C. and density irradiation energy within 10 to 60 J/cm$^2$.

Irradiation energy density exceeding 60 J/cm$^2$ causes an increase of heat stress along with excessive and abrupt energy, which results in damage such as slips or cracks in the silicon substrate. The preheating has an effect of controlling the required flash-lamp irradiation energy density and reducing the occurrence of heat stress in the substrate caused by the abrupt rise in temperature. When attempting to heat the silicon substrate surface with only the flash lamp, the energy charged into the lamp becomes large, and life expectancy of the lamp is shortened. Accordingly, the preheating has a further effect of controlling the required lamp irradiation energy density and prolonging lamp life expectancy.

In order to make the lamp irradiation energy be 60 J/cm$^2$ or lower so as to activate the impurity to high concentration, it is desirable to set the preheating temperature to 200° C. or higher.

Meanwhile, when the preheating temperature is set to a temperature higher than 550° C., the total energy amount becomes excessive due to the lighting of the flash lamp, and since the silicon substrate temperature remains high and impurity diffusion continues due to the remaining heat after turning off the light, it is difficult to obtain a shallow junction. Also, since the substrate becomes breakable and easily damaged when the preheating temperature is set excessively high, an appropriate temperature range is desired in order to prevent damage to the substrate. Accordingly, a preheating temperature of between 200 and 550° C. is desirable.

The preheating means may be means capable of heating the substrate from 200 to 550° C. Heating with a heating element such as a hot plate may be used as well as heating with a lamp such as a halogen lamp.

In addition, a xenon flash lamp is used as the light source of the flash-lamp annealing according to the embodiment, but the type of lamp used is not limited to this. A light source capable of supplying the required irradiation energy and adjusting the lighting time to be extremely short may be possible. It is desirable that the lighting time, or irradiation time be adjustable to 100 ms or shorter, more desirably 10 ms or shorter, and even more preferably several ms or shorter. For example, it is possible to use a laser such as an excimer laser or YAG laser capable of pulse oscillation. It should be noted that the xenon flash lamp heats substrates effectively since the xenon flash lamp has a light-emitting wavelength ranging from the visible region to the near-infrared region where the single crystal silicon substrate shows a high absorptivity. However in the case of using other light sources, irradiation energy utilization efficiency may also increase by using a light source having wavelength of under 1100 nm, where the single crystal silicon substrate shows a high absorptivity.

With the above-mentioned two-stage annealing method of this embodiment, the pre-anneal (first heat treatment) and flash-lamp annealing (second heat treatment) may be performed independently using a first heat treatment apparatus including a halogen lamp and a second heat treatment apparatus including a xenon flash lamp, and if an annealing apparatus including both the heating source for pre-annealing and the heating source for flash-lamp annealing in the same chamber is used, two-stage annealing may be performed continuously using one annealing apparatus.

Figure 8:
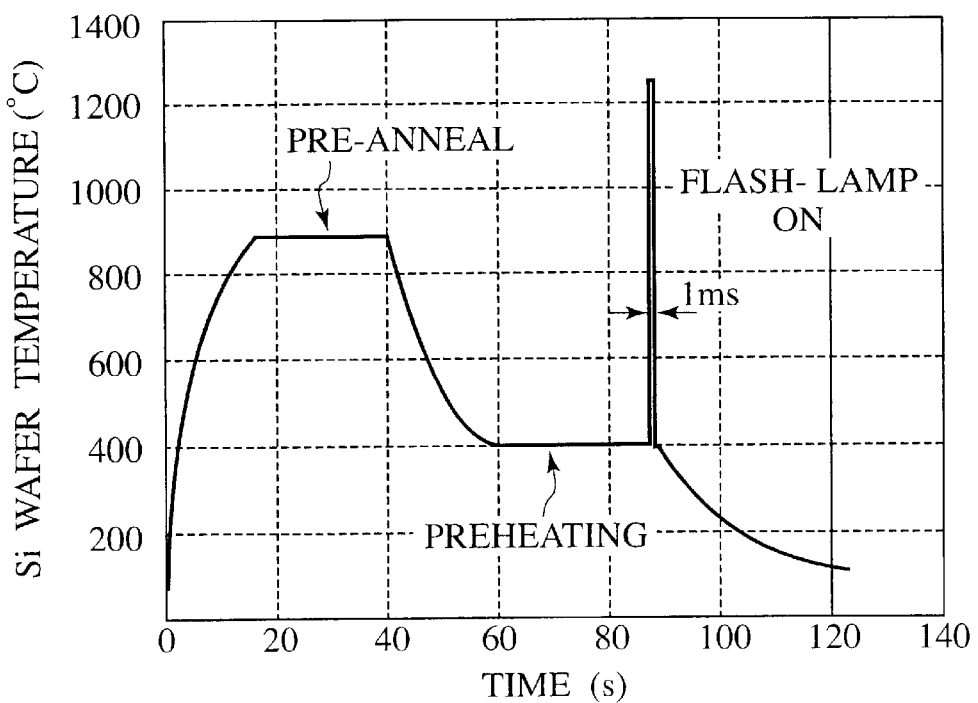
FIG. 8 is a diagram illustrating the temperature profile in the case of performing pre-annealing (first heat treatment) and flash-lamp annealing (second heat treatment) continuously according to another embodiment of the present invention.

FIG. 8 is a graph illustrating an example of the temperature profile in the case of performing a pre-anneal and flash-lamp annealing continuously. As shown in the figure, a pre-anneal (first heat treatment) is performed under the conditions of, for example, a heating temperature of 900° C. and a heating time of 20 seconds, and then performing flash-lamp annealing (second heat treatment) continuously. In other words, when temperature is settled by lowering the substrate temperature to the preheating temperature, for example 400° C., the xenon flash lamp is turned on for 1 ms.

In the case of performing two-stage annealing continuously using one annealing apparatus, since it is unnecessary for the substrate temperature to lower to room temperature in the middle of processing and the handling required to load the substrate in and out of the chamber may be saved, it is possible to increase throughput as well as eliminate waste in apparatus space and production facilities.

Figure 9:
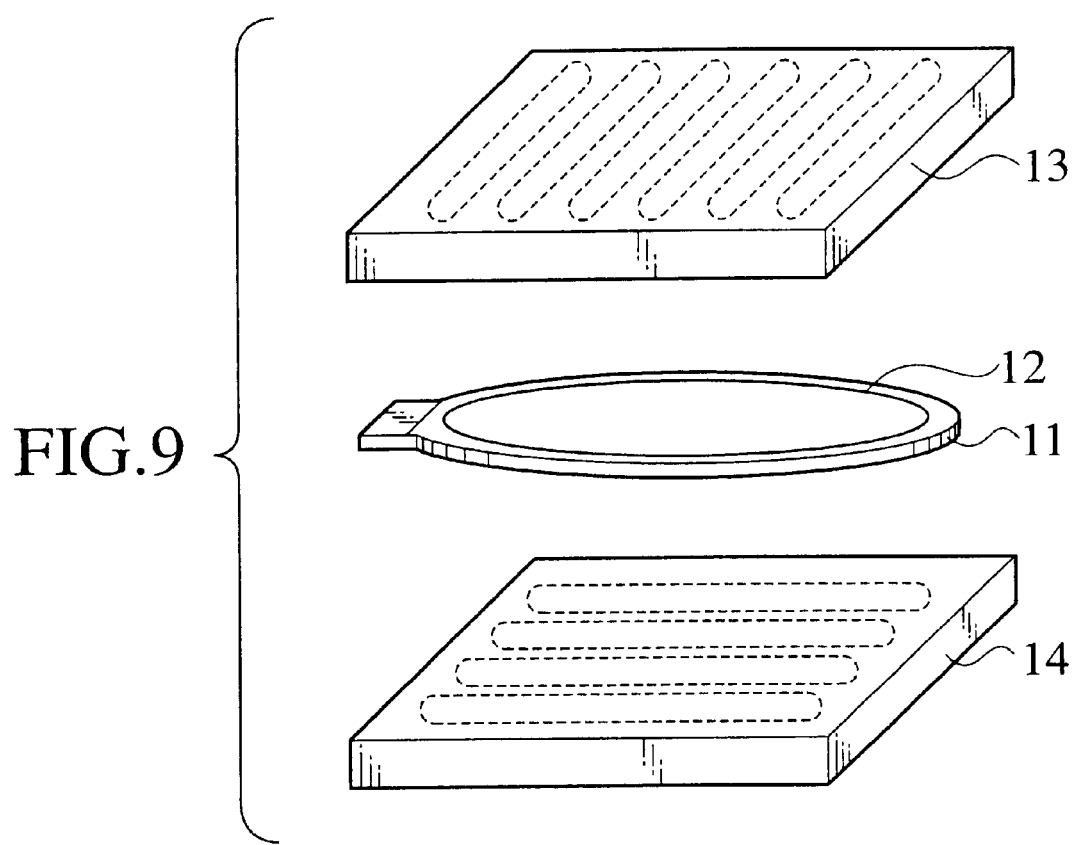
FIG. 9 is a diagram illustrating a schematic configuration of an annealing apparatus including a xenon flash lamp and a halogen lamp within the same chamber.

FIG. 9 is a diagram illustrating a schematic configuration of an annealing apparatus including a heating source for pre-annealing and another heating source for flash-lamp annealing. A xenon flash lamp 13 is arranged above, and a halogen lamp 14 is arranged below, and therebetween is arranged a substrate base 11 for mounting a substrate 12. For the pre-anneal (first heat treatment), the lower halogen lamp 14 is used by itself. For the flash-lamp annealing (second heat treatment), both the halogen lamp 14 and the xenon flash lamp 13 are used, wherein preheating of the substrate is performed with the halogen lamp 14 and flash-lamp annealing is performed by the xenon flash lamp. It should be noted that in the case where the halogen lamp 14 and xenon flash lamp 13 are configured with a plurality of pole-shaped lamp groups, the respective directions of lamp arrangement for the halogen lamp 14 and xenon flash lamp 13 are preferably arranged so as to intersect each other.

It should be noted that an integrated hot plate with a substrate base may be used instead of the halogen lamp 14. In addition, an excimer laser or YAG laser capable of extremely short pulse emissions may be used instated of the xenon flash lamp.

As described above, with the semiconductor apparatus manufacturing method according to this embodiment, since it is possible to form a shallow impurity diffusion layer with low resistance and control the gate electrode depletion, it is possible to accurately control the impurity profile. Furthermore, since the number of processes does not increase using the annealing apparatus shown in FIG. 8, it is possible to form a miniaturized, low cost, high-performance MOS transistor without lowering throughput.

While details of the present invention has been described in line with this embodiment, it will be apparent to those skilled in the art that various modifications and improvements are possible. For example, boron is used as the p-type impurity in this embodiment, however, other group III elements capable of being an acceptor may be used instead. In addition, a p-MOS type transistor is described in the above-mentioned example, however, the above-mentioned semiconductor manufacturing method may be similarly applied to an n-MOS type transistor having inverted conductivity. In this case, phosphorus (P) or arsenic (As), which are capable of being a donor, may be ion implanted as the impurity in order to form the source/drain region.

As described above, the semiconductor apparatus manufacturing method of the present invention includes a first heat treatment process performing the heat treatment at a temperature for diffusing the impurity implanted mainly in the gate electrode and controlling the diffusion of the impurity implanted in the surface layer of the semiconductor substrate and a second heat treatment process performing the heat treatment at a higher temperature and for a shorter time than those of the first heat treatment at a temperature for activating the impurity implanted in the semiconductor substrate. Since the impurity is easier to diffuse at a lower temperature in the polycrystal gate electrode than in the single crystal semiconductor substrate, the impurity diffusion in the semiconductor substrate is suppressed by the first heat treatment, while impurity in the gate electrode are diffused throughout the gate electrode in order to prevent depletion at the bottom of the gate electrode by the first heat treatment. Then the impurities in the semiconductor substrate and gate electrode are activated by the second heat treatment. Since this second heat treatment is performed at a high temperature for a short time, it is possible to activate the impurity with little diffusion. Accordingly, a shallow junction depth is kept for the impurity diffusion layer formed in the semiconductor substrate even if this two-stage annealing is performed. Thus it is possible to form a semiconductor apparatus, such as a transistor, which has a further miniaturized and shallower junction without causing the problem of gate electrode depletion.

In the above-mentioned semiconductor apparatus manufacturing method, the impurity implantation processes may include a first ion implantation process that performs ion implantation in the semiconductor substrate surface layer in the region adjacent to the gate electrode and forms the first impurity ion implantation region, and a second ion implantation process that performs ion implantation in the semiconductor substrate surface layer in the region apart from the gate electrode and forms the second impurity ion implantation region which is deeper than the first impurity ion implantation region.

In this case, it is possible to form a shallower impurity diffusion region, that is, an extension region in the semiconductor substrate surface layer adjacent to the gate electrode. Accordingly, it is possible to control the short channel effect that occurs when forming a further miniaturized transistor.

In addition, a third heat treatment process may be included with the same conditions as the above-mentioned second heat treatment process between the first ion implantation process and the second ion implantation process.

In this case, with the third annealing process performed after the first ion implantation process, it is possible to obtain an extension region having a shallow junction since high-temperature and short-time annealing is performed as with the second heat treatment process.

A poly-Si film is given as the above-mentioned polycrystal conductive film.

It is preferable that the above-mentioned first heat treatment process be performed under conditions where the annealing temperature is between 600° C. and 950° C., and the annealing time continues from five seconds to one hour in accordance with temperature conditions.

In addition, the above-mentioned first heat treatment process may be implemented using an infrared lamp or a hot plate. Here, a halogen lamp is given as the infrared lamp.

It is desirable that the annealing time of the above-mentioned second heat treatment process be 100 ms or shorter.

In addition, the above-mentioned second heat treatment process may be implemented using a light source capable of adjusting the irradiation time to be 100 ms or shorter. It is desirable that a light source having 10 to 60 J/cm$^2$ of irradiation energy density be used as this light source. For example, a xenon flash lamp may be given as this light source. It is further desirable that the xenon flash lamp irradiation time be 10 ms or shorter. In addition, an excimer laser or YAG laser may be used besides the xenon flash lamp.

It is desirable that the above-mentioned second heat treatment process be performed under conditions where the semiconductor substrate has been preheated to a temperature lower than the heat treatment temperature in the first heat treatment process.

It is possible to prevent damage to the substrate caused by the abrupt rise in substrate temperature due to the short-time and high-temperature annealing by performing preheating.

It is desirable that the above-mentioned preheating temperature be between 200 and 600° C. In addition, the above-mentioned preheating may be implemented using an infrared lamp or hot plate.

The above-mentioned first heat treatment process and second heat treatment process may be executed continuously in the same chamber using a single annealing apparatus.

In this case, it is possible to eliminate handling the substrate between the first heat treatment process and second heat treatment process, and without the sacrifice in throughput with the two-stage annealing.

As the above mentioned annealing apparatus, an apparatus that includes a chamber in which the substrate may be enclosed and held, a first heating source having a light source where irradiation time is 100 ms or shorter and irradiation energy density is 10 to 60 J/cm$^2$ in the chamber, and a second heating source made from a halogen lamp or a hot plate may be used. It should be noted that a xenon flash lamp is desired for the first heating source.

According to the above-mentioned annealing apparatus, the above-mentioned semiconductor apparatus manufacturing method of the present invention may be implemented without sacrificing throughput since two-stage annealing, which includes a first heat treatment process and a second heat treatment process of the above-mentioned semiconductor apparatus manufacturing method of the present invention, may be performed continuously in the same chamber.

What is claimed is:

1. A method of manufacturing a semiconductor device, comprising:

forming a gate insulating layer upon a single crystal semiconductor substrate;

forming a gate electrode made from a polycrystal conductive film upon the gate insulating layer;

implanting impurity into the gate electrode and into a surface layer of the semiconductor substrate adjacent to or separate from the gate electrode;

performing a first heat treatment so as to diffuse impurity implanted mainly in the gate electrode and control the diffusion of impurity implanted in the surface layer of the semiconductor substrate; and performing a second heat treatment, which performs heat treatment at a higher temperature and for a shorter time than the first heat treatment, so as to activate the impurity implanted in the semiconductor substrate.

2. The method according to claim 1, wherein the implanting impurity comprises:

performing a first ion implantation, which performs ion implantation into the surface layer of the semiconductor substrate in a region adjacent to the gate electrode and forms a first impurity ion implantation region; and 1)

performing a second ion implantation, which performs ion implantation into the surface layer of the semiconductor substrate in a region separate from the gate electrode so as to form a second impurity ion implantation region deeper than the first impurity ion implantation region.

3. The method according to claim 1, further comprising:

following the first ion implantation and preceding the second ion implantation, performing a third annealing with the same conditions as the second heat treatment.

4. The method according to claim 1, wherein the polycrystal conductive film is a polycrystal silicon film.

5. The method according to claim 1, wherein the first heat treatment is performed under conditions where annealing temperature is between 600° C. and 950° C., and annealing time is from five seconds to one hour depending on temperature conditions.

6. The method according to claim 1, wherein the first heat treatment is implemented using an infrared lamp or a hot plate.

7. The method according to claim 6, wherein the infrared lamp is a halogen lamp.

8. The method according to claim 1, wherein the annealing time of the second heat treatment is 100 ms or shorter.

9. The method according to claim 1, wherein the second heat treatment is implemented using a light source capable of adjusting the irradiation time to be 100 ms or shorter.

10. The method according to claim 1, wherein a light source having a 10 to 60 J/cm$^2$ of irradiation energy density is used in the second heat treatment.

11. The method according to claim 10, wherein the light source is a xenon flash lamp.

12. The method according to claim 11, wherein the irradiation time of the xenon flash lamp is 10 ms or shorter.

13. The method according to claim 10, wherein the light source is an excimer laser or YAG laser.

14. The method according to claim 1, wherein the second heat treatment is performed under conditions where the semiconductor substrate is preheated to a lower temperature than the annealing temperature in the first heat treatment.

15. The method according to claim 14, wherein the preheating temperature is between 200 and 600° C.

16. The method according to claim 14, wherein the preheating is implemented by using an infrared lamp or hot plate.

* * * * *